(12) United States Patent
Kruit et al.

(10) Patent No.: US 9,123,507 B2
(45) Date of Patent: Sep. 1, 2015

(54) ARRANGEMENT AND METHOD FOR TRANSPORTING RADICALS

(71) Applicant: MAPPER LITHOGRAPHY IP B.V., Delft (NL)

(72) Inventors: Pieter Kruit, Delft (NL); Marc Smits, Pijnacker (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/385,802

(22) PCT Filed: Mar. 20, 2013

(86) PCT No.: PCT/EP2013/055865
§ 371 (c)(1),
(2) Date: Sep. 17, 2014

(87) PCT Pub. No.: WO2013/139878
PCT Pub. Date: Sep. 26, 2013

(65) Prior Publication Data
US 2015/0028223 A1    Jan. 29, 2015

Related U.S. Application Data (60) Provisional application No. 61/613,391, filed on Mar. 20, 2012.

(51) Int. Cl.
*H01J 37/02* (2006.01)
*H01J 37/317* (2006.01)
(Continued)

(52) U.S. Cl.
CPC ............. *H01J 37/3174* (2013.01); *B82Y 10/00* (2013.01); *B82Y 40/00* (2013.01); *F15D 1/025* (2013.01);
(Continued)

(58) Field of Classification Search
CPC ............. H01J 37/3174; H01J 37/3177; H01J 2237/0435; H01J 2237/31774; H01J 2237/022; H01J 37/32862; C23C 16/4405
USPC .......................................... 250/492.1–492.3
See application file for complete search history.

(56) References Cited

U.S. PATENT DOCUMENTS 4,555,303 A    11/1985   Legge et al.
4,870,030 A     9/1989   Markunas et al.
(Continued)

FOREIGN PATENT DOCUMENTS

EP     1150332 A2    10/2001
EP     0797236 B1     8/2003
WO   WO-0022661 A1    4/2000

OTHER PUBLICATIONS

Wieland et al, "MAPPER: High throughput maskless lithography", Alternative Lithographic Technologies, SPIE vol. 7271, 72710O, 2009.

*Primary Examiner* — Michael Maskell
(74) *Attorney, Agent, or Firm* — Hoyng Monegier LLP; David P. Owen (57) ABSTRACT

The invention relates to an arrangement for transporting radicals. The arrangement includes a plasma generator and a guiding body. The plasma generator includes a chamber (2) in which a plasma may be formed. The chamber has an inlet (5) for receiving an input gas, and one or more outlets (6) for removal of at least one of the plasma and radicals created therein. The guiding body is hollow and is arranged for guiding radicals formed in the plasma towards an area or volume at which contaminant deposition is to be removed. The chamber inlet is coupled to a pressure device (40) for providing a pulsed pressure into the chamber so as to create a flow in the guiding body.

14 Claims, 7 Drawing Sheets

(51) Int. Cl.
  *G03F 7/20* (2006.01)
  *B82Y 10/00* (2011.01)
  *B82Y 40/00* (2011.01)
  *F15D 1/02* (2006.01)
  *H01J 9/38* (2006.01)
  *H01J 37/32* (2006.01)

(52) U.S. Cl.
  CPC ............... *G03F 7/70925* (2013.01); *H01J 9/38* (2013.01); *H01J 37/3177* (2013.01); *G21K 2201/06* (2013.01); *H01J 37/32862* (2013.01); *H01J 2237/006* (2013.01); *H01J 2237/022* (2013.01); *H01J 2237/3173* (2013.01); *H01J 2237/327* (2013.01); *Y10T 137/2082* (2015.04); *Y10T 137/87571* (2015.04)

(56) References Cited

U.S. PATENT DOCUMENTS

| | | | |
|---|---|---|---|
| 5,312,519 A * | 5/1994 | Sakai et al. .................... 134/1.1 |
| 5,466,942 A * | 11/1995 | Sakai et al. ................ 250/492.2 |
| 5,539,211 A * | 7/1996 | Ohtoshi et al. ........... 250/441.11 |
| 5,554,257 A * | 9/1996 | Yokogawa et al. ........... 438/730 |
| 5,770,862 A | 6/1998 | Ooaeh et al. |
| 5,788,778 A | 8/1998 | Shang et al. |
| 5,981,960 A * | 11/1999 | Ooaeh et al. ................ 250/492.2 |
| 6,182,603 B1 * | 2/2001 | Shang et al. ........... 118/723 ME |
| 6,394,109 B1 | 5/2002 | Somekh |
| 6,427,703 B1 | 8/2002 | Somekh |
| 6,465,795 B1 | 10/2002 | Madonado et al. |
| 6,958,804 B2 | 10/2005 | Wieland et al. |
| 7,084,414 B2 | 8/2006 | Wieland et al. |
| 7,129,502 B2 | 10/2006 | Kruit |
| 7,147,722 B2 | 12/2006 | Klebanoff et al. |
| 8,075,789 B1 | 12/2011 | Littau et al. |
| 8,921,807 B2 * | 12/2014 | Takase et al. ............ 250/453.11 |
| 2002/0144706 A1 | 10/2002 | Davis et al. |
| 2004/0141169 A1 | 7/2004 | Wieland et al. |
| 2004/0165160 A1 | 8/2004 | Van Beek et al. |
| 2006/0094219 A1 * | 5/2006 | Soda .............................. 438/597 |
| 2007/0131878 A1 | 6/2007 | Banine et al. |
| 2009/0174870 A1 | 7/2009 | De Jong et al. |
| 2009/0212229 A1 | 8/2009 | Wieland et al. |
| 2010/0095979 A1 | 4/2010 | Hua et al. |
| 2010/0139708 A1 | 6/2010 | Mirura |
| 2012/0178025 A1 | 7/2012 | Tanaka et al. .................. 430/296 |
| 2012/0181455 A1* | 7/2012 | Nakayama et al. ........ 250/492.1 |
| 2012/0288799 A1 | 11/2012 | Takase |

* cited by examiner

ARRANGEMENT AND METHOD FOR TRANSPORTING RADICALS

BACKGROUND OF THE INVENTION

1. Field of the Invention

The invention relates to an arrangement and method for transporting radicals, for example for removal of contaminant deposits. The invention further relates to a charged particle lithography system comprising such arrangement. The invention further relates to a pressure regulator for connection to a plasma chamber. The invention further relates to a method for transporting radicals.

2. Description of the Related Art

The accuracy and reliability of charged particle lithography systems is negatively influenced by contamination. An important contribution to contamination in such lithography system is caused by the build-up of deposits of contaminants. The charged particles being part of the patterning beamlets and being produced in the system interact with hydrocarbons already present in the system. The resulting Electron Beam Induced Deposition (EBID) forms a carbon containing layer on surface in the system. This layer of carbon containing material influences beam stability. Build-up of such carbon containing layer in and around apertures through which the charged particle beams and/or beamlets pass also reduces the size of the apertures and reduces transmission of beams or beamlets through these apertures. Removal of EBID, in particular in areas with relatively high hydrocarbon partial pressures and relatively high beam current densities, is therefore highly desirable.

Such deposits can be reduced or removed by atom cleaning. This may be achieved using a plasma generator to produce a stream of atoms to react with the deposits. The transport of plasma and the atoms provided therein, in particular radicals, is often inefficient, which may lead to relatively long cleaning periods, and insufficient cleaning quality, i.e. incomplete or inadequate removal of contaminants on a specific surface or a specific volume.

SUMMARY OF THE INVENTION

It is an object of the invention to provide an arrangement and method for transporting radicals, for example towards a region where contaminant deposits are to be removed, in a more efficient manner. For this purpose, some embodiments of the invention relate to an arrangement for transporting radicals, for example for removal of contaminant deposition, the arrangement comprising: a plasma generator comprising a chamber in which a plasma may be formed, the chamber comprising an inlet for receiving an input gas, and one or more outlets for removal of at least one of the plasma and radicals created therein; and a hollow guiding body for guiding radicals formed in the plasma towards an area or volume at which contaminant deposition is to be removed; wherein the chamber inlet is coupled to a pressure device for providing a pulsed pressure into the chamber so as to create a flow in the guiding body. By increasing the pressure inside the chamber 2 in a pulsed manner, the radicals that are generated therein are no longer moving in a molecular flow regime, but instead, they are moving in a so-called viscous pressure regime. In the viscous pressure regime the plasma forms a flow, which may be referred to as viscous flow, which transports the radicals During these periods of locally increased pressure, the radicals can be guided towards the guiding body which may significantly increase the efficiency of transfer of radicals, and optionally, plasma. As a result, the number of atom radicals being transferred through the guiding body towards the desired location, e.g. a contaminated area, increases. Additionally, by providing the periods of locally increased pressure in a pulsed manner, the possible risk of plasma extinction in the guiding body is reduced.

Preferably, the pressure device is a valve. A valve enables quick opening and closing of the inlet, which enables providing a pulsed pressure at a relatively high frequency.

In some embodiments, the invention relates to an arrangement for transporting radicals, for example for removal of contaminant deposition, the arrangement comprising: a plasma generator comprising a chamber in which a plasma may be formed, the chamber comprising an inlet for receiving an input gas, and one or more outlets for removal of at least one of the plasma and radicals created therein; and a hollow guiding body coupled to the one or more chamber outlets for guiding radicals formed in the plasma towards an area or volume at which contaminant deposition is to be removed; wherein the pressure within the chamber can be increased temporarily to form a flow with sufficient strength to drag along radicals. A temporarily increased pressure inside the guiding body may cause the plasma to extinguish. Furthermore such pressure increase may increase a reduction of radicals due to recombination, for example by three body interaction (radical+radical+molecule). However, even under the unlikely circumstances that one or both of these events would occur, the more efficient transfer of radicals from the chamber towards an outlet of the guiding body as a result of the increased pressure outweighs radical losses due to temporary plasma extinction and/or recombination. In particular, the increased pressure may cause an increase of the number of radicals being transferred. If the pressure increase is of a pulsed nature, the chances of plasma extinction reduces significantly, so that the increased efficiency of radical transport may be combined with survival of the plasma in the guiding body.

In some embodiments, the invention relates to an arrangement for transporting radicals, for example for removal of contaminant deposition, the arrangement comprising: a plasma generator comprising a chamber in which a plasma may be formed, the chamber comprising an inlet for receiving an input gas, and one or more outlets for removal of at least one of the plasma and radicals created therein; a hollow guiding body coupled to the one or more outlets of the chamber for guiding radicals formed in the plasma towards an area or volume at which contaminant deposition is to be removed; and a pressure regulator having an inlet with a first cross-sectional area, and an outlet with a second cross-sectional area, the first cross-sectional area being greater than the second cross-sectional area, the pressure regulator inlet being coupled to the one or more chamber outlets, the pressure regulator outlet being coupled to the guiding body; wherein the pressure regulator is provided with a further inlet for receiving further inlet gas. The presence of a further inlet in the funnel pressure regulator opens the possibility to independently tune the pressure inside the chamber and inside the guiding body. The conductance of the guiding body may now be designed such that the pressure inside the guiding body is below an optimum. The optimum pressure may then be accomplished by inserting additional gas via the further inlet in the pressure regulator. So, the pressure in the chamber may be optimized to generate radicals, while the pressure inside the guiding body may be optimized by means of controlled supply of suitable gas via the further inlet to guide the radicals towards its outlet.

The chamber of the plasma generator may comprise flow restrictor, such as a perforated wall. The flow restrictor aids to maintain a pressure difference between the chamber of the plasma generator and the environment to which the outlet of the pressure regulator is connected, generally a vacuum environment. The pressure differential between a position at the inlet of the pressure regulator and the outlet of the guiding body aids in creating a flow of radicals, optionally in combination with a plasma flow.

Summarizing, arrangements as described above increase a radical transportation efficiency through the guiding body.

Some embodiments of the invention relate to a pressure regulator for connection to a chamber containing a plasma, the pressure regulator having an inlet for receiving at least one of plasma and radicals created therein, the inlet having a first cross-sectional area, and an outlet with a second cross-sectional area, the first cross-sectional area being greater than the second cross-sectional area, the pressure regulator inlet being coupled to the plasma chamber, the pressure regulator outlet being removably attachable to a hollow body. The pressure regulator may take the form of a funnel. The pressure regulator may be provided with a further inlet for receiving a further inlet gas, for example for the purpose as described earlier.

Some embodiments of the invention relate to a lithography system comprising: a beamlet generator for generating a plurality of beamlets; a plurality of beamlet manipulator elements for manipulating the beamlets; and an arrangement according to one of abovementioned embodiments, wherein the arrangement is adapted to generate plasma and radicals created therein and to direct the radicals onto a surface of one or more of the beamlet manipulator elements. Examples of beamlet manipulator elements include, but are not limited to a projection lens structure and a beamlet modulation structure. By directing the radicals, optionally in combination with the plasma, to the surface of one or more of the beamlet manipulator elements, contaminant deposits may be removed locally in an efficient manner.

The lithography system may be a charged particle lithography system. Each beamlet manipulator element may then comprise a plurality of apertures through which beamlets pass. A beamlet modulation structure may then take the form a blanker structure, i.e. an arrangement of a plurality of blankers, the blankers being capable of deflecting one or more charged particle beamlets. Typically, the blankers are electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential. In a charged particle lithography system the projection lens structure may include one or more electrostatic lens arrays.

In some other embodiments, the lithography system is an extreme ultraviolet (EUV) lithography system. In such system, each beamlet manipulator element may take the form of an reflective element, such as a mirror, which orientation may be controllable.

Some embodiments of the invention relate to a method for transporting radicals, the method comprising: providing an arrangement according to one of abovementioned embodiments with an end of the hollow guiding body in close proximity of the surface; inserting an input gas into the chamber; forming a plasma and radicals in the chamber; and creating a flow of radicals towards the end of the hollow guiding body. Preferably, creating a flow comprises providing a pulsed pressure into the chamber by means of a pressure device, such as a valve or a pump. A valve is very efficient, because it operates fast, and can be operated at relatively high frequencies.

Finally, some embodiments of the invention relate to a method for transporting radicals, the method comprising: providing an arrangement according to one of the abovementioned embodiments with an end of the hollow guiding body in close proximity of the surface; inserting an input gas into the chamber; forming a plasma and radicals in the chamber; and temporarily increasing the pressure within the chamber to form a flow with sufficient strength to drag along radicals.

BRIEF DESCRIPTION OF THE DRAWINGS

Embodiments of the invention will now be described, by way of example only, with reference to the accompanying schematic drawings in which:

FIG. 6b schematically shows a more detailed view of the pressure regulator used in FIG. 6a;

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
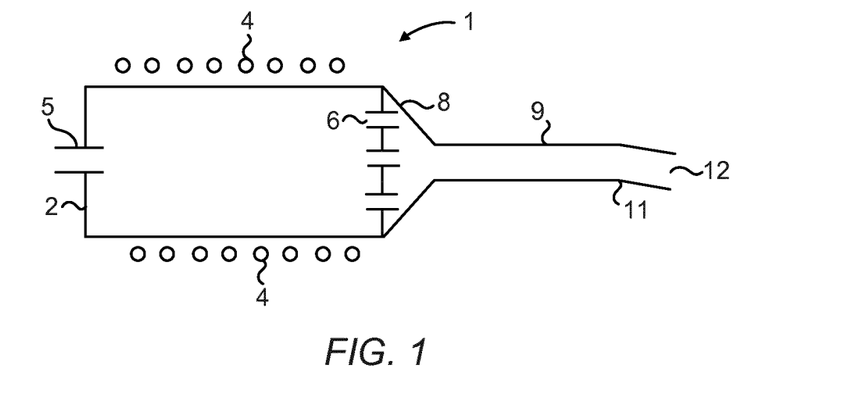
FIG. 1 schematically shows an arrangement for transporting radicals according to an embodiment of the invention.

FIG. 1 schematically shows an arrangement 1 for transporting radicals, for example for removal of contaminant deposition, in particular contaminants being deposited on surfaces that are located within a vacuum environment. Because the arrangement 1 operates using a plasma, such arrangement may also be referred to as plasma source. The arrangement 1 comprises a radio frequency (RF) plasma generator comprising a chamber 2 with an RF coil 4 around the outside of the chamber 2. The chamber 2 is provided with an inlet 5 for allowing entry into the chamber 2 of an input gas, such as oxygen. The input gas is a precursor for the radicals to be generated in the chamber 2, and is preferably selected in view of the intended use of these radicals. The gas in the chamber 2 may be energized with an RF voltage applied over the coil 4 so as to produce a plasma including radicals, such as oxygen atom radicals. The plasma and radicals may leave the chamber 2 via one or more outlets 6.

The arrangement 1 further comprise a pressure regulator, such as a funnel 8, and a guiding body, such as tube 9, for focusing and guiding the plasma and radicals created therein towards a predetermined destination area. The guiding body may be straight or may comprise one or more bends, such as a bend 11 (depicted in FIG. 1) or a elbow 12 (depicted in FIG. 2) to direct the plasma in a desired direction. Preferably, the guiding body is as straight as possible to increase the average lifetime of radicals being transferred through the guiding body. The guiding body has an outlet 12 which may be located in close proximity of the contaminant deposition to be reduced or removed. Typically, the outlet 12 is in direct contact with a vacuum environment.

In some embodiments, the chamber 2 is provided with flow restrictor, such as a perforated wall creating a plurality of outlets 6 which may take the form of an aperture array. The flow restrictor aids to maintain a pressure difference between the chamber 2 of the plasma generator and the environment to which the outlet of the pressure regulator is connected, generally a vacuum environment. The pressure differential between a position at the inlet of the pressure regulator and the outlet of the guiding body aids in creating a flow of radicals.

Figure 2:
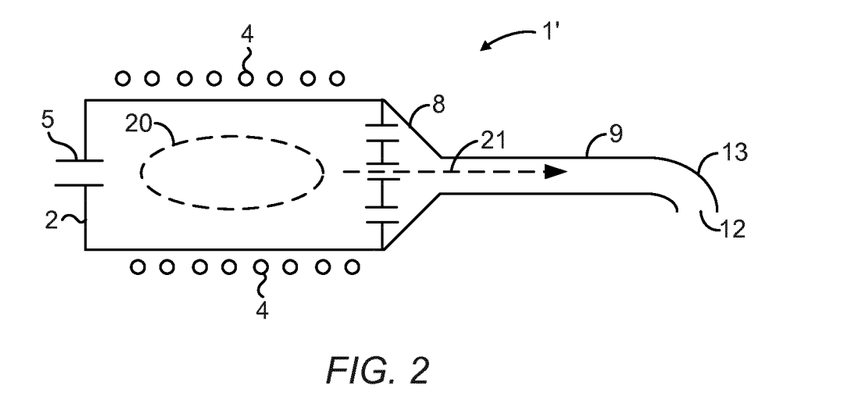
FIG. 2 shows an arrangement for transporting radicals according to another embodiment of the invention.

FIG. 2 shows an arrangement 1' for transporting radicals. The arrangement 1' which is similar to the arrangement 1 of FIG. 1 with the exception that the guiding body takes the form of a tube 9 including a turn or elbow 13 as an alternative to a bend 11 as depicted in the arrangement of FIG. 1. Furthermore, FIG. 2 shows the arrangement 1' in operation under conditions such that a plasma 20 is generated in the chamber 2. It will be understood that the arrangement shown in FIG. 1 may be operated in a similar manner.

In particular, an input gas, such as oxygen, is supplied to the chamber 2 and the RF coil 4 is energized to inductively heat the input gas, and a plasma 20 is generated in the chamber 2. The plasma 20, and in particular radicals produced therein, may exit the chamber 2 as schematically represented by dashed arrow 21 and flow into the funnel 8 and tube 9.

In case of the use of oxygen, oxygen radicals from the plasma generator 1 are employed for removing or reducing contaminant deposits, in particular caused by EBID contamination. The oxygen radicals that are generated in the chamber 2 are guided towards the to be reduced or removed contaminant deposition via the funnel 8 and the guiding body. The funnel 8 and/or guiding body may be made of an inert material, such as quartz or polytetrafluoroethylene (better known under the name Teflon®, or their inner surface may be coated with such inert material to suppress extinction of oxygen atom radicals when they interact with these elements.

Hereafter, embodiments of the invention will be described with reference to oxygen atom radicals. However, it will be understood that some embodiments of the invention may employ other radicals. Furthermore, although reference is made to transport of radicals, such reference does not exclude transport of plasma in combination with radicals.

For removing electron beam induced deposition (generally "carbon") from surfaces, for example surfaces of one or more beamlet manipulator elements in a lithography system, radicals, such as oxygen atom radicals, may be used. Such oxygen atom radicals may be produced inside chamber 2 of the arrangements 1, 1' shown in FIGS. 1 and 2.

Unfortunately, major losses of radicals are observed in these arrangements 1, 1', which is understandable because the radicals in these arrangements are transported in a so-called molecular flow regime. In such regime, the interactions of radicals with other radicals can be ignored, whereas an interaction with a wall can lead to recombination. Furthermore, radicals leave the chamber 2 and enter the guiding body, i.e. tube 9 in FIGS. 1, 2, over the entire outlet with random angles.

Figure 3:
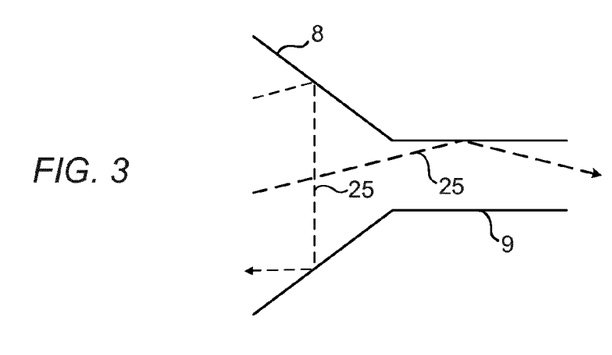
FIG. 3 depicts some exemplary trajectories of radicals in a molecular flow regime.

Some exemplary trajectories of radicals in the molecular flow regime are depicted in FIG. 3 as dashed lines 15. As can be seen in FIG. 3, radicals may not enter the guiding body at all, but will "bounce back".

The inventors realized that the efficiency of the radical transport depends on the pressures that are used throughout the arrangement 1, 1'. The pressure inside the chamber 2 determines the efficiency of the plasma, and the number of radicals that are generated therein. The pressure inside the guiding body (and the funnel 8) determines the efficiency of transport of radicals through the guiding body.

Figure 4:
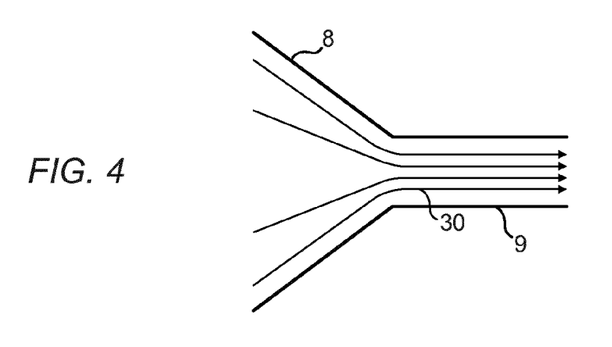
FIG. 4 depicts some exemplary trajectories of radicals in a viscous flow regime.

By increasing the pressure inside the chamber 2 in a pulsed manner, the radicals that are generated therein are no longer moving in a molecular flow regime, but instead, they are moving in a so-called viscous pressure regime instead. In the viscous pressure regime the plasma forms a flow, which may be referred to as viscous flow, which transports the radicals, for example in a way as schematically shown in FIG. 4 by the arrows. During these periods of locally increased pressure, the radicals can be guided towards the guiding body which may significantly increase the number of atom radicals that are being transferred through the guiding body towards the desired location, e.g. a contaminated area.

In some embodiments, the temporarily increased pressure inside the guiding body causes the plasma to extinguish. It is also possible that in some embodiments the reduction of radicals due to recombination, for example by three body interaction (radical+radical+molecule), increases as a result of the temporarily increased pressure. However, the increase of the number of radicals that are transferred from the chamber 2 towards the tube outlet 12 due to the presence of the flow that is being formed outweighs radical losses due to temporary plasma extinction and recombination.

Figure 5A:
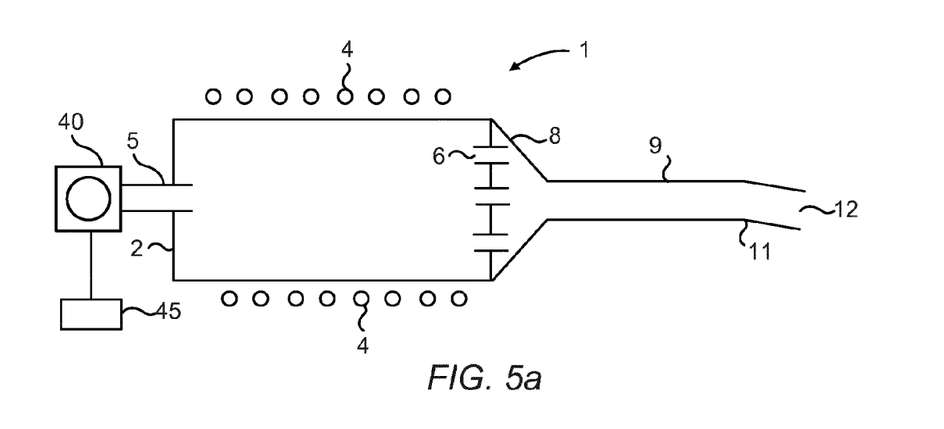
FIG. 5a schematically shows the arrangement of FIG. 1, further comprising a pressure device.

FIG. 5a schematically shows the arrangement 1 of FIG. 1, further comprising a pressure device 40, preferably a valve, but optionally another entity, such as a pump, that is controllable via a control unit 45. The control unit 45 may be arranged to arrange a temporary increase of pressure in the chamber 2 to form a flow with sufficient strength to drag along radicals from the chamber 2 towards the tube outlet 12. The control unit 45 may control a pressure device 40 such as a pump directly. However, the control unit 45 may also control one or more valves to control the connection between such pump and the chamber 2.

The pressure device 40 may be controlled in such a way that the pressure in the chamber experiences periodic pressure pulses, i.e. the pressure is increased temporarily in a periodic way. The pressure increase may result in temporarily allowing more input gas into the chamber 2 via inlet 5. Alternatively, the pressure increase may be established by inserting additional input gas via one or more other inlets.

Figure 5B:
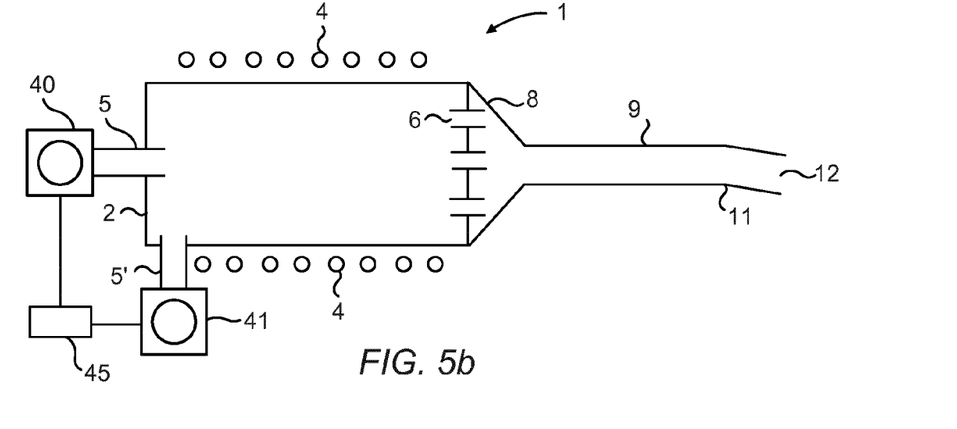
FIG. 5b schematically shows the arrangement of FIG. 5a, further comprising an additional inlet.

Alternatively, or additionally, a temporary pressure increase may be accomplished by inserting a further input gas, for example nitrogen gas. The further input gas may be inserted via inlet 5. Alternatively, the further input gas may be inserted via an additional inlet 5' of the chamber 2, as depicted in FIG. 5b. The additional inlet 5' may be coupled to a pressure device 41, e.g. a valve or a pump, and may be controlled by a control unit, such as control unit 45.

In the arrangement of FIGS. 5a, 5b, the pressure inside the chamber 2 and inside the guiding body, in these embodiment a tube 9, can not be independently tuned. Both pressures are related by the conductance of the one or more outlets 6 and by the conductance of the tube 9 itself. Furthermore, as mentioned earlier, in this arrangement the temporarily increased pressure inside the tube 9 may cause the plasma to extinguish.

Figure 6A:
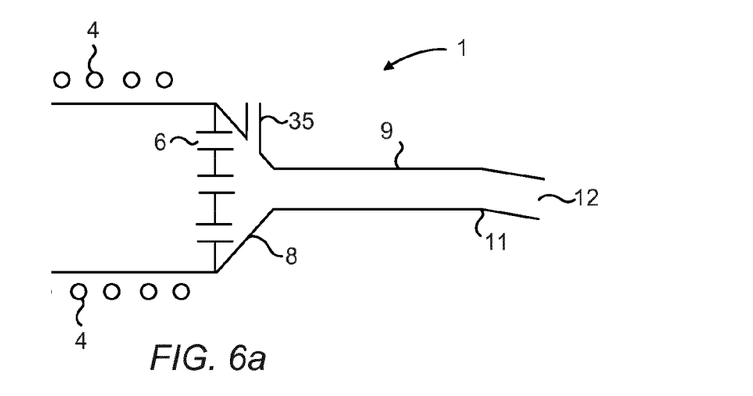
FIG. 6a schematically shows an alternative embodiment of an arrangement in which a pressure regulator is provided with a further inlet.
Figure 6B:
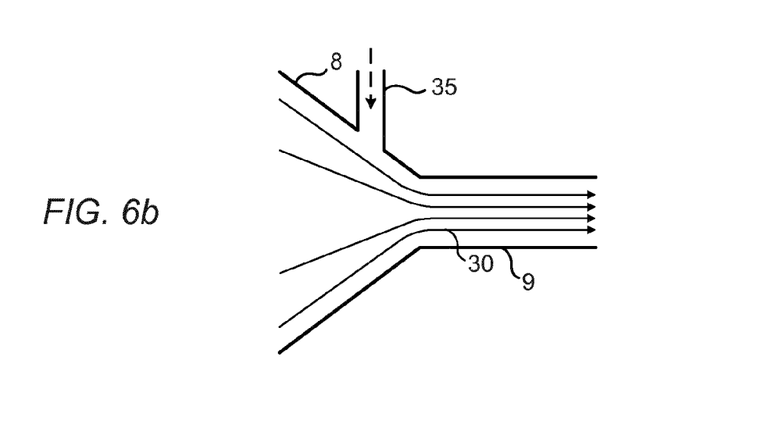

FIG. 6a shows an alternative embodiment of an arrangement in which a pressure regulator, such as a funnel 8, is provided with a further inlet 35 for supply of additional input gas, such as oxygen, or a buffer gas such as nitrogen. Hereafter, gas supplied via the further inlet 35 will be referred to as further inlet gas. The funnel 8 of FIG. 6a is depicted in more detail in FIG. 6b. The presence of a further inlet 35 in the funnel 8 opens the possibility to independently tune the pressure inside the chamber 2 and inside the tube 9. The conductance of the tube 9 may now be designed such that the pressure inside the tube 9 is below an optimum. The optimum pressure may then be accomplished by inserting additional gas via the further inlet 35. The pressure in the chamber 2 may then be optimized to generate radicals and the pressure inside the guiding body may be optimized by means of controlled supply of suitable gas via the further inlet 35 to guide the radicals towards its outlet. Implementation of the further inlet 35 may also reduce the risk that the plasma extinguishes in the tube 9. The further inlet 35 may be connected to a pressure device, such as a valve or a pump. The pressure device may be connected to a control unit, such as the control unit 45.

Figure 7:
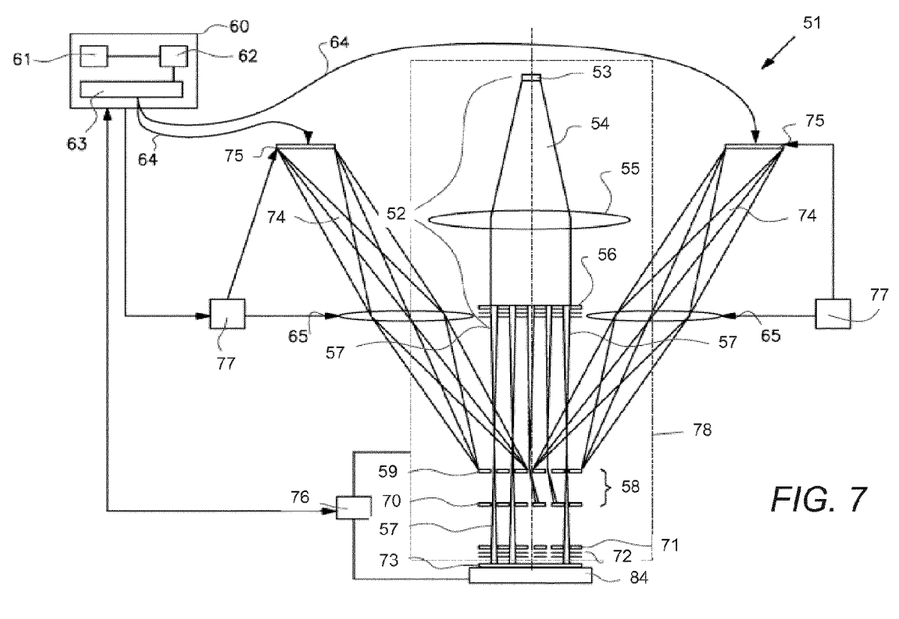
FIG. 7 shows a simplified schematic drawing of an embodiment of a charged particle multi-beamlet lithography system.

FIG. 7 shows a simplified schematic drawing of an embodiment of a charged particle multi-beamlet lithography system 51. Such lithography system is for example described in U.S. Pat. Nos. 6,897,458 and 6,958,804 and 7,084,414 and 7,129,502, which are assigned to the applicant of the present application and which are hereby incorporated by reference in their entirety.

Such lithography system 51 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 7 is an electron source 53 arranged to produce a substantially homogeneous, expanding electron beam 54. The beam energy of the electron beam 54 is preferably maintained relatively low in the range of about 1 to 10 keV. To achieve this, the acceleration voltage is preferably low, and the electron source 53 may be kept at a voltage between about −1 to −10 kV with respect to the target at ground potential, although other settings may also be used.

In FIG. 7, the electron beam 54 from the electron source 53 passes a collimator lens 55 for collimating the electron beam 54. The collimator lens 55 may be any type of collimating optical system. Before collimation, the electron beam 54 may pass a double octopole (not shown).

Subsequently, the electron beam 54 impinges on a beam splitter, in the embodiment of FIG. 7 an aperture array 56. The aperture array 56 preferably comprises a plate having through-holes. The aperture array 56 is arranged to block part of the beam 54. Additionally, the array 56 allows a plurality of beamlets 57 to pass through so as to produce a plurality of parallel electron beamlets 57.

The lithography system 51 of FIG. 7 generates a large number of beamlets 57, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 54 and to create electron beamlets 57 from the subbeam. This allows for manipulation of the subbeams further downstream, which turns out beneficial for the system operation, particularly when the number of beamlets in the system is 5,000 or more.

The beamlet modulator, denoted in FIG. 7 as modulation system 58, typically comprises a beamlet blanker array 59 comprising an arrangement of a plurality of blankers, and a beamlet stop array 70. The blankers are capable of deflecting one or more of the electron beamlets 57. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 57 within the plane of the blanker array 50 the lithography system may further comprise a condenser lens array (not shown).

In the embodiment of FIG. 7, the beamlet stop array 70 comprises an array of apertures for allowing beamlets to pass through. The beamlet stop array 70, in its basic form, comprises a substrate provided with through-holes, typically round holes although other shapes may also be used. In some embodiments, the substrate of the beamlet stop array 70 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 59 and the beamlet stop array 70 operate together to block or let pass the beamlets 57. In some embodiments, the apertures of the beamlet stop array 70 are aligned with the apertures of the electrostatic deflectors in the beamlet blanker array 59. If beamlet blanker array 59 deflects a beamlet, it will not pass through the corresponding aperture in the beamlet stop array 70. Instead the beamlet will be blocked by the substrate of beamlet block array 70. If beamlet blanker array 59 does not deflect a beamlet, the beamlet will pass through the corresponding aperture in the beamlet stop array 70. In some alternative embodiments, cooperation between the beamlet blanker array 59 and the beamlet stop array 70 is such that deflection of a beamlet by a deflector in the blanker array 59 results in passage of the beamlet through the corresponding aperture in the beamlet stop array 70, while non-deflection results in blockage by the substrate of the beamlet stop array 70.

The modulation system 58 is arranged to add a pattern to the beamlets 57 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 74 holding pattern data may be transmitted to a projector 65 which projects light from the ends of fibers within a fiber array (schematically depicted as plate 75) into the electron optical portion of the lithography system 51, schematically denoted by the dashed box and reference number 78.

In the embodiment of FIG. 7, the modulated light beams are projected on to the beamlet blanker array 59. More particularly, the modulated light beams 74 from optical fiber ends are projected on corresponding light sensitive elements located on the beamlet blanker array 59. The light sensitive elements may be arranged to convert the light signal into a different type of signal, for example an electric signal. A modulated light beam 74 carries a portion of the pattern data for controlling one or more blankers that are coupled to a corresponding light sensitive element. Suitably, in order to project the light beams 74 onto corresponding light sensitive elements optical elements such as a projector 65 may be used. Additionally, to allow projection of the light beams 74 at a suitable incident angle, a mirror may be included, for example suitably placed between a projector 65 and the beamlet blanker array 59.

The projector 65 may be appropriately aligned with the plate 75 by a projector positioning device 77 under control of the control unit 60. As a result, the distance between the projector 65 and the light sensitive elements within the beamlet blanker array 59 may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 75 and a projector 65 located away from the space that may be occupied by the charged particle beamlets has the advantage that the beamlet disturbance is minimized, and the construction of the beamlet blanker array 59 is less complex.

The modulated beamlets coming out of the beamlet modulator are projected as a spot onto a target surface 73 of a target 84 by the beamlet projector. The beamlet projector typically comprises a scanning deflector for scanning the modulated beamlets over the target surface 73 and a projection lens system for focusing the modulated beamlets onto the target surface 73. These components may be present within a single end module.

Such end module is preferably constructed as an insertable, replaceable unit. The end module may thus comprise a deflector array 71, and a projection lens arrangement 72. The insertable, replaceable unit may also include the beamlet stop array 70 as discussed above with reference to the beamlet modulator. After leaving the end module, the beamlets 57 impinge on a target surface 73 positioned at a target plane. For lithography applications, the target usually comprises a wafer provided with a charged-particle sensitive layer or resist layer.

The deflector array 71 may take the form of a scanning deflector array arranged to deflect each beamlet 57 that passed the beamlet stop array 70. The deflector array 71 may comprise a plurality of electrostatic deflectors enabling the application of relatively small driving voltages. Although the deflector array 71 is drawn upstream of the projection lens arrangement 72, the deflector array 71 may also be positioned between the projection lens arrangement 72 and the target surface 73.

The projection lens arrangement 72 is arranged to focus the beamlets 57, before or after deflection by the deflector array 71. Preferably, the focusing results a geometric spot size of about 10 to 30 nanometers in diameter. In such preferred embodiment, the projection lens arrangement 72 is preferably arranged to provide a demagnification of about 100 to 500 times, most preferably as large as possible, e.g. in the range 300 to 500 times. In this preferred embodiment, the projection lens arrangement 72 may be advantageously located close to the target surface 73.

In some embodiments, a beam protector (not shown) may be located between the target surface 73 and the projection lens arrangement 72. The beam protector may be a foil or a plate provided with a plurality of suitably positioned apertures. The beam protector is arranged to absorb the released resist particles before they can reach any of the sensitive elements in the lithography system 51.

The projection lens arrangement 72 may thus ensure that the spot size of a single pixel on the target surface 73 is correct, while the deflector array 71 may ensure by appropriate scanning operations that the position of a pixel on the target surface 73 is correct on a microscale. Particularly, the operation of the deflector array 71 is such that a pixel fits into a grid of pixels which ultimately constitutes the pattern on the target surface 73. It will be understood that the macroscale positioning of the pixel on the target surface 73 is suitably enabled by a wafer positioning system present below the target 84.

Commonly, the target surface 73 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Although reference is made in particular to a charged particle multi-beamlet lithography system, some embodiments of the invention may be directed to other types of lithography systems, such as lithography systems using extreme ultraviolet (EUV) radiation for exposure purposes. In EUV lithography systems reflective surfaces, such as mirrors, are used to create a patterned or modulated radiation beam or to influence the trajectories of beamlets such that selected beamlets reach the target to be exposed, typically a wafer provided with a suitable resist layer.

Figure 8:
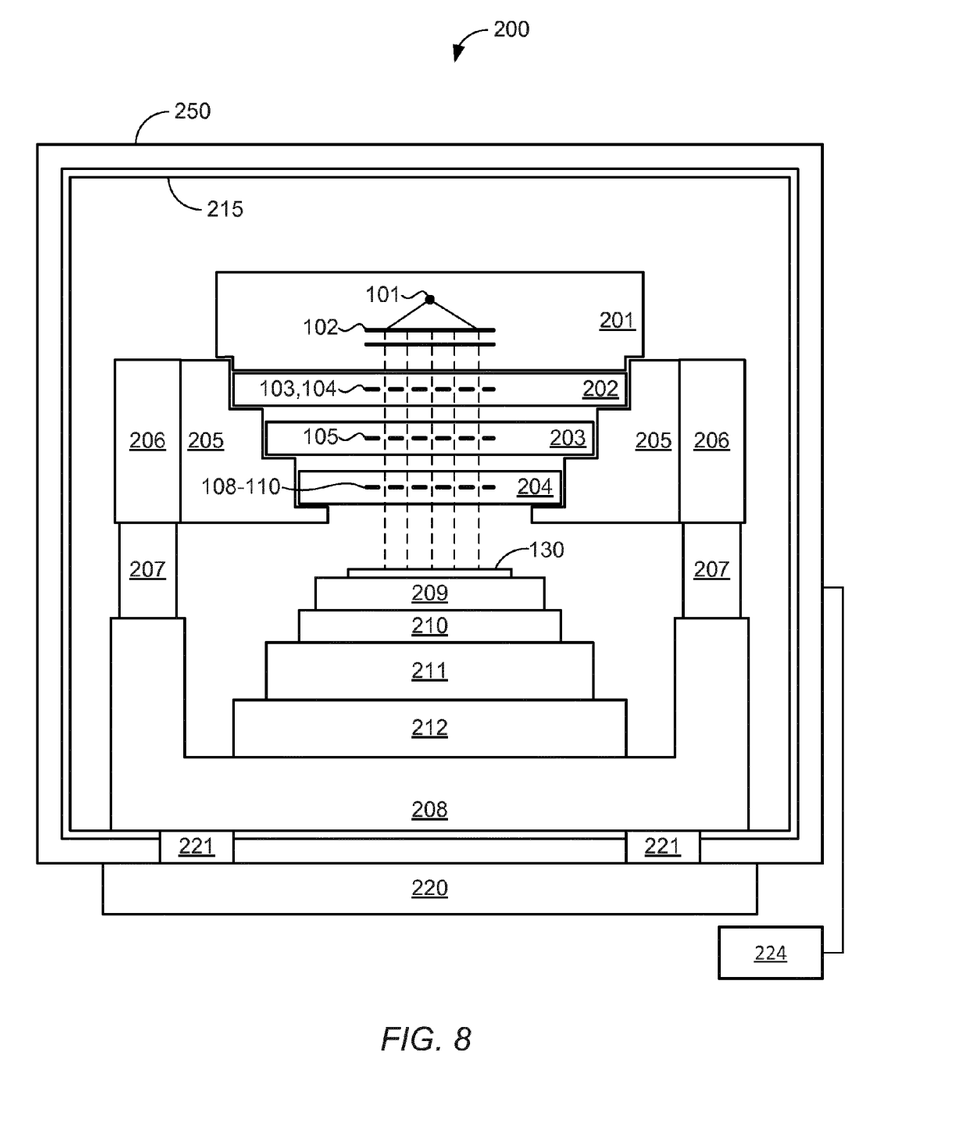
FIG. 8 shows a simplified block diagram of a modular lithography system.

FIG. 8 shows a simplified block diagram of a modular lithography system. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 8 these modular subsystems include an illumination optics module 201 including a charged particle beam source 101 and a beam collimating system 102, an aperture array and condenser lens module 202 including an aperture array 103 and a condenser lens array 104, a beam switching module 203 including a beamlet blanker array 105, and a projection optics module 204 including a beam stop array 108, a beam deflector array 109, and projection lens arrays 110. The modules may be designed to slide in and out from an alignment frame. In the embodiment shown in FIG. 8, the alignment frame comprises an alignment inner sub-frame 205 and an alignment outer sub-frame 206. The projection optics module 204 may be connected to at least one of the alignment inner sub-frame 205 and the alignment outer sub-frame by means of one or more flexures.

Abovementioned components in the illumination optics module 201, the aperture array and condenser lens module 202, the beam switching module 203 and the projection optics module 204 may be arranged to operate in correspondence to the functionality of similar components with respect to the lithography system 1 of FIG. 7.

In the embodiment of FIG. 8, a frame 208 supports the alignment sub-frames 205 and 206 via vibration damping mounts 207. In this embodiment, a wafer 130 rests on a wafer table 209, which is in turn mounted on further supporting structure 210. The combination of wafer table 209 and further supporting structure 210 may hereafter also be referred to as chuck 210. The chuck 210 sits on the stage short stroke 211 and long stroke 212. The lithography machine is enclosed in vacuum chamber 250, which preferably includes a mu metal shielding layer or layers 215. The machine rests on a base plate 220 supported by frame members 221.

Each module may require a large number of electrical signals and/or optical signals, and electrical power for its operation. The modules inside the vacuum chamber receive these signals from one or more control systems 224, which are typically located outside of the chamber. The vacuum chamber 250 includes openings, referred to as ports, for admitting cables carrying the signals from the control systems into the vacuum housing while maintaining a vacuum seal around the cables. Each module preferably has its collection of electrical, optical, and/or power cabling connections routed through one or more ports dedicated to that module. This enables the cables for a particular module to be disconnected, removed, and replaced without disturbing cables for any of the other modules. In some embodiments, a patch panel may be provided within the vacuum chamber 250. The patch panel comprises one or more connectors for removably connecting one or more connections of the modules. One or more ports may be used for admitting the one or more connections of the removable modules into the vacuum chamber.

Figure 9:
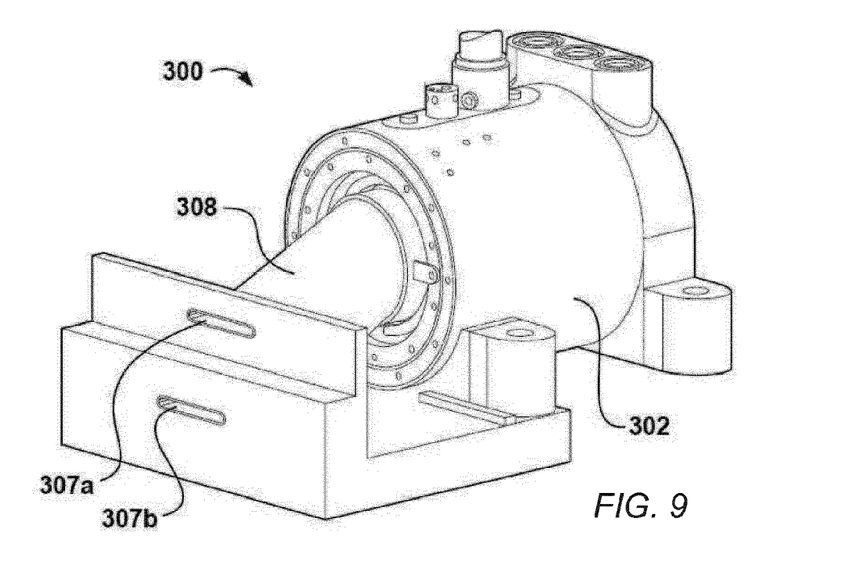
FIG. 9 shows an elevated top view of an embodiment of an arrangement for transporting radicals.

FIG. 9 shows an elevated top view of an embodiment of an arrangement 300 for removal of contaminant deposition. The arrangement 300 comprises a chamber 302 in which a plasma may be formed coupled to a pressure regulator in the form of a funnel 308. The funnel 308 is provided with two outlets in the form of slits 307a, 307b.

Figure 10:
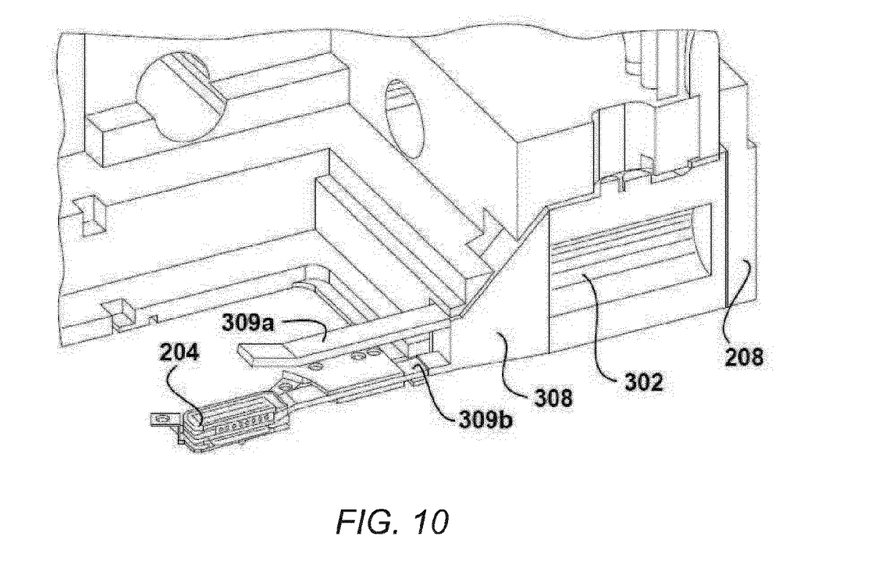
FIG. 10 shows a cross-sectional view of a modular lithography system comprising the arrangement depicted in FIG. 9.

FIG. 10 shows a cross-sectional view of a modular lithography system comprising the arrangement for removal of contaminant deposition depicted in FIG. 9. In the shown embodiment, the modular lithography system is the system discussed with reference to FIG. 8. The chamber 302, and in this particular embodiment also the funnel 308, are integrated into the alignment frame 208 for accommodating one or more of the modules. The arrangement further comprises a first tube 309a connected to the slit 307a, and a second tube 309b connected to the slit 307b. The second tube 309b has an outlet close to the surface of the projection optics module 204. The first tube 309a is arranged to transfer radicals to another module, for example beam switching module 203 in the modular lithography system of FIG. 8.

Figure 11:
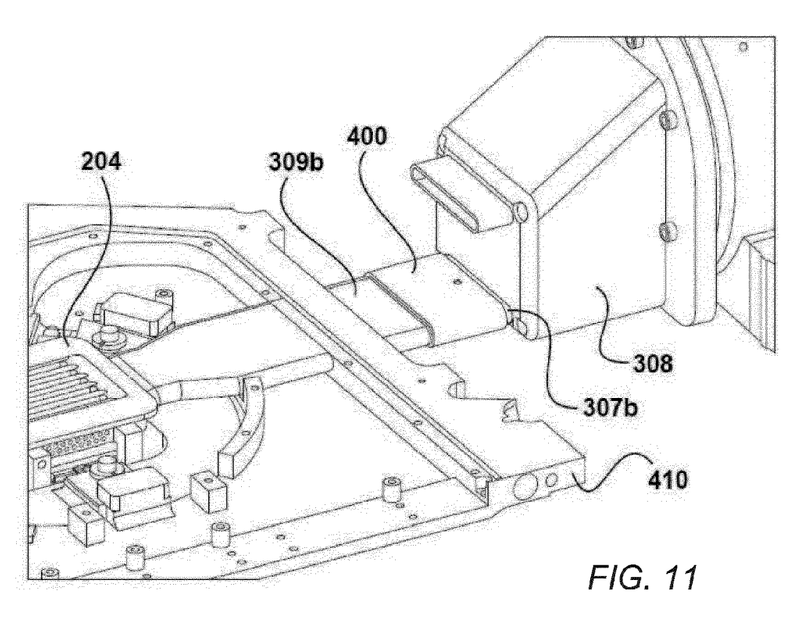
FIG. 11 shows a more detailed view of an embodiment of a connection between a pressure regulator of the arrangement depicted in FIG. 9 and a module for use in a lithography system as depicted in FIG. 8.

FIG. 11 shows a more detailed view of an embodiment of a connection between the funnel 308 and the projection optics module 204 using tube 309b. Similar connections may be made between the funnel 308 and other modules. In the shown connection the tube 309b can be clicked onto an extended portion of the slit 307b. The pressure regulator outlet 307b is thus provided with an extended portion onto which the guiding body, i.e. tube 309b in FIG. 11, is removably attachable.

Furthermore, a cover 400 is provided which can placed over the location of the actual connection to reduce leakage of particles, such as atom radicals, towards the tube surroundings. The cover 400 may be a slideable cover.

The tube 309b is preferably as straight as possible to minimize interaction of atom radicals with the inner walls of the tube 309b. In this particular embodiment, the projection optics module 204 is mounted onto a module plate 410, and the tube 309b goes through the plate 410. Such construction reduces the space being occupied by plate 410 and tube 309b.

The invention has been described by reference to certain embodiments discussed above. It will be recognized that these embodiments are susceptible to various modifications and alternative forms well known to those of skill in the art without departing from the scope of the invention, which is defined in the accompanying claims.

The invention claimed is:

1. Electron beam lithography system comprising:
   a beamlet generator for generating a plurality of electron beamlets;
   a plurality of beamlet manipulator elements for manipulating the electron beamlets, at least one of the beamlet manipulator elements comprising an aperture array;
   a plasma generator comprising a chamber in which a plasma may be formed, the chamber comprising an inlet for receiving an input gas, and one or more outlets for removal of at least one of the plasma and radicals created therein;
   a hollow guiding body for guiding radicals formed in the plasma towards the aperture array at which contaminant deposition is to be removed; and
   a pressure regulator having an inlet with a first cross-sectional area, and an outlet with a second cross-sectional area, the first cross-sectional area being greater than the second cross-sectional area, the pressure regulator inlet being coupled to the one or more chamber outlets, the pressure regulator outlet being coupled to the guiding body,
   wherein the chamber is provided with a flow restrictor.

2. Electron beam lithography system according to claim 1, wherein the flow restrictor is a perforated wall.

3. Electron beam lithography system according to claim 1, wherein the pressure regulator takes the form of a funnel.

4. Electron beam lithography system according to claim 1, wherein the pressure regulator outlet is provided with an extended portion onto which the guiding body is removably attachable.

5. Electron beam lithography system according to claim 4, further comprising a cover for placement over the connection between the guiding body and the extended portion of the pressure regulator outlet.

6. Electron beam lithography system according to claim 1, wherein the pressure regulator is provided with a further inlet for receiving an inlet gas.

7. Electron beam lithography system according to claim 1, wherein the hollow guiding body takes the form of a tube.

8. Electron beam lithography system according to claim 1, wherein the plasma generator further comprises a radio frequency coil around the outside of the chamber for generating a plasma within the chamber.

9. Pressure regulator for connection to a chamber containing a plasma, the pressure regulator having an inlet for receiving at least one of plasma and radicals created therein, the inlet having a first cross-sectional area, and an outlet with a second cross-sectional area, the first cross-sectional area being greater than the second cross-sectional area, the pressure regulator inlet being coupled to the plasma chamber, the pressure regulator outlet being removably attachable to a hollow body.

10. Pressure regulator according to claim 9, wherein the pressure regulator takes the form of a funnel.

11. Pressure regulator according to claim 9, wherein the pressure regulator is provided with a further inlet for receiving an inlet gas.

12. Method for transporting radicals, the method comprising:
- providing an electron beam lithography system according to claim 1 with an end of the hollow guiding body in close proximity of the area or volume at which contaminant deposition is to be removed;
- inserting an input gas into the chamber;
- forming a plasma and radicals in the chamber; and
- creating a flow of radicals towards the end of the hollow guiding body, and wherein the lithography system is provided with a pressure regulator according to claim 11, and wherein the method further comprises inserting an inlet gas via the further inlet of the pressure regulator.

13. Method according to claim 12, wherein the plasma generator of the electron beam lithography system comprises a radio frequency coil around the outside of the chamber, and wherein forming a plasma comprises energizing the radio frequency coil.

14. Method according to claim 12, wherein the input gas is oxygen.

\* \* \* \* \*